US006373071B1

(12) United States Patent
Innes et al.

(10) Patent No.: US 6,373,071 B1
(45) Date of Patent: Apr. 16, 2002

(54) REAL-TIME PREDICTION OF PROXIMITY RESIST HEATING AND CORRECTION OF RASTER SCAN ELECTRON BEAM LITHOGRAPHY

(75) Inventors: Robert Innes, Richmond; Sergey Babin, Castro Valley, both of CA (US); Robin Teitzel, Portland, OR (US); Lee Veneklasen, Castro Valley, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/343,960

(22) Filed: Jun. 30, 1999

(51) Int. Cl.$^{7}$ .................................................. G03C 5/02

(52) U.S. Cl. .................. 250/492.22; 700/121; 430/296; 430/30

(58) Field of Search .................... 250/492.22; 700/121; 430/296, 30

(56) References Cited

U.S. PATENT DOCUMENTS 3,720,832 A 3/1973 Apple ........................ 250/250
4,010,367 A 3/1977 Suzuki ....................... 250/334
4,102,194 A 7/1978 Eng ........................... 340/342
4,426,584 A 1/1984 Bohlen et al. .............. 250/430
4,439,049 A 3/1984 Hoogendoorn et al. ..... 374/124
4,504,558 A 3/1985 Bohlen et al. .............. 250/430
4,563,682 A 1/1986 Merkel ....................... 340/340
4,712,010 A 12/1987 Alm ........................... 250/334
4,719,350 A 1/1988 Alm ........................... 250/330
4,821,337 A 4/1989 Alm ............................ 382/58
4,859,832 A 8/1989 Uehara et al. .............. 219/219
5,051,598 A 9/1991 Ashton et al. .............. 250/492
5,085,525 A 2/1992 Bartosiak et al. ........... 374/124
5,219,226 A 6/1993 James ........................ 374/124
5,254,438 A 10/1993 Owen et al. ................ 430/296
5,336,892 A 8/1994 Dobisz et al. ........... 250/492.2
5,432,714 A 7/1995 Chung et al. ............... 365/525
5,532,496 A 7/1996 Gaston .................. 250/492.22
5,736,281 A 4/1998 Watson ....................... 430/430
5,745,388 A 4/1998 Mimotogi et al. .......... 364/364
5,767,521 A 6/1998 Takeno et al. .............. 250/250
5,838,013 A 11/1998 Butsch et al. .............. 250/250
5,847,959 A 12/1998 Veneklasen et al. ........ 364/250
5,863,682 A 1/1999 Abe et al. ................... 430/430
5,876,885 A 3/1999 Mimotogi et al. .......... 430/430
5,876,902 A 3/1999 Veneklasen et al. ........ 430/430
5,879,844 A 3/1999 Yamamoto et al. ......... 430/430
5,889,686 A 3/1999 Mimotogi et al. .......... 364/364

OTHER PUBLICATIONS

PCT International Search Report & Transmittal PCT/US 0017706, Oct. 25, 2000.

Babin et al., Simulation and Measurement of Resist Heating in Multipass Exposure Using a 50 KV variably shaped beam system, (May 1999).

Babin, et al., Software for Temperature Simulation, (Mar. 1, 1998).

(List continued on next page.)

*Primary Examiner*—Jack Berman
(74) *Attorney, Agent, or Firm*—Greg Leitich

(57) ABSTRACT

The present invention relates to methods of predicting proximity heating of resists in electron beam lithography in real-time as the writing proceeds enabling beam compensation in current and/or dwell time to be performed during writing. A shifted impulse response function is shown to give proximity heating results accurate to within a few percent. A method of using a precomputed kernel capable of proximity resist temperature evaluation in real-time as beam writing proceeds.

19 Claims, 4 Drawing Sheets

Figure 1A:
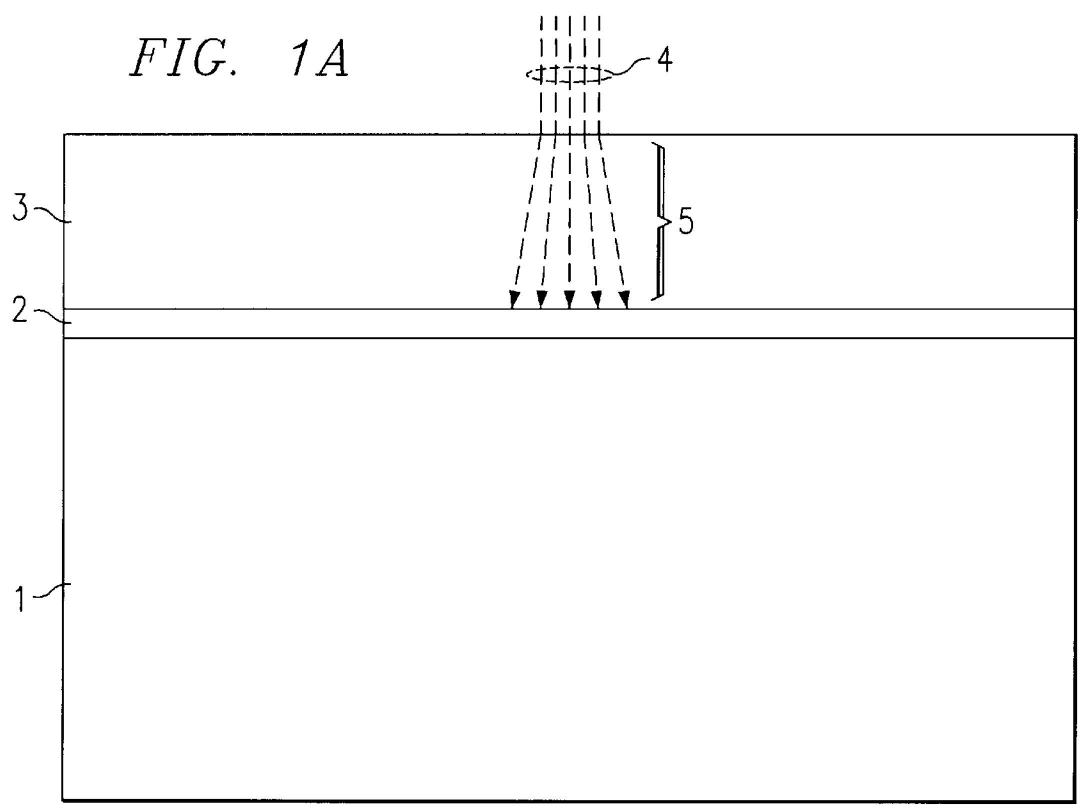

| | 1 | 2 | 3 | 4 | 5 | 6 | 7 | 8 9 | 10 13 | 14 21 | 22 37 | 38 69 | 70 133 | 134 261 | 262 517 | 518 1029 | 1030 2053 | 2054 4101 | 4102 8197 | 8198 16389 |
|---|---|---|---|---|---|---|---|---|---|---|---|---|---|---|---|---|---|---|---|---|
| | | | | | | | | | | | | | | | | | | | 0.003 | |
| | | | | | | | | | | | | | | | | | | | 0.003 | |
| | | | | | | | | | | | | | | | | | | | 0.004 | |
| | | | | | | | | | | | | | | | | | | | 0.004 | |
| | | | | | | | | | | | | | | | | | | 0.003 | 0.005 | |
| | | | | | | | | | | | | | | | | | | 0.004 | 0.005 | |
| | | | | | | | | | | | | | | | | | | 0.004 | 0.005 | |
| | | | | | | | | | | | | | | | | | | 0.005 | 0.006 | |
| | | | | | | | | | | | | | | | | | | 0.006 | 0.006 | 0.003 |
| | | | | | | | | | | | | | | | | | | 0.007 | 0.007 | 0.003 |
| | | | | | | | | | | | | | | | | | 0.004 | 0.008 | 0.007 | 0.003 |
| | | | | | | | | | | | | | | | | | 0.005 | 0.009 | 0.008 | 0.003 |
| 32 | | | | | | | | | | | | | | | | | 0.006 | 0.010 | 0.008 | 0.004 |
| 31 | | | | | | | | | | | | | | | | | 0.008 | 0.011 | 0.009 | 0.004 |
| 30 | | | | | | | | | | | | | | | | | 0.009 | 0.013 | 0.009 | 0.004 |
| 29 | | | | | | | | | | | | | | | | 0.004 | 0.011 | 0.014 | 0.010 | 0.004 |
| 28 | | | | | | | | | | | | | | | | 0.006 | 0.014 | 0.016 | 0.011 | 0.004 |
| 27 | | | | | | | | | | | | | | | | 0.008 | 0.017 | 0.017 | 0.011 | 0.004 |
| 26 | | | | | | | | | | | | | | | | 0.012 | 0.020 | 0.019 | 0.012 | 0.004 |
| 25 | | | | | | | | | | | | | | | 0.005 | 0.016 | 0.023 | 0.020 | 0.012 | 0.004 |
| 24 | | | | | | | | | | | | | | | 0.008 | 0.021 | 0.027 | 0.022 | 0.012 | 0.004 |
| 23 | | | | | | | | | | | | | | | 0.013 | 0.026 | 0.030 | 0.024 | 0.013 | 0.004 |
| 22 | | | | | | | | | | | | | | 0.005 | 0.020 | 0.033 | 0.034 | 0.025 | 0.013 | 0.005 |
| 21 | | | | | | | | | | | | | | 0.011 | 0.030 | 0.041 | 0.038 | 0.026 | 0.014 | 0.005 |
| 20 | | | | | | | | | | | | | 0.005 | 0.022 | 0.042 | 0.049 | 0.042 | 0.028 | 0.014 | 0.005 |
| 19 | | | | | | | | | | | | | 0.014 | 0.039 | 0.057 | 0.057 | 0.045 | 0.029 | 0.014 | 0.005 |
| 18 | | | | | | | | | | | | 0.009 | 0.035 | 0.064 | 0.074 | 0.066 | 0.048 | 0.030 | 0.015 | 0.005 |
| 17 | | | | | | | | | | | 0.009 | 0.036 | 0.074 | 0.095 | 0.091 | 0.073 | 0.051 | 0.031 | 0.015 | 0.005 |
| 16 | | | | | | | | | 0.004 | 0.017 | 0.052 | 0.100 | 0.130 | 0.129 | 0.107 | 0.079 | 0.053 | 0.031 | 0.015 | 0.005 |
| 15 | | | 0.004 | 0.007 | 0.010 | 0.012 | 0.014 | 0.031 | 0.066 | 0.121 | 0.177 | 0.204 | 0.192 | 0.158 | 0.118 | 0.083 | 0.054 | 0.032 | 0.015 | 0.005 |
| 14 | 0.386 | 0.302 | 0.237 | 0.191 | 0.158 | 0.133 | 0.114 | 0.187 | 0.268 | 0.325 | 0.332 | 0.293 | 0.234 | 0.175 | 0.125 | 0.085 | 0.055 | 0.032 | 0.015 | 0.005 |

OTHER PUBLICATIONS

Yasuda et al., Resist Heating Effect in Electron Beam Lithography (Feb. 1994).

H.I. Ralph, et al., "Resist Heating in High Speed Electron Beam Pattern Generators," Proceedings of the Symposium on Electron and Ion Beam Science and Technology, Tenth International Conference, (Undated) The Electrochemical Society, Inc., Proceedings Vol. 83–2.

S. Babin, et al., "CD–Variation in 30 kV EBL due to Resist Heating: Experiment and Simulation," (1997) SPIE, vol. 3048.

M. Yasuda, et al., "Resist heating effect in electron beam lithography," (1994) pp. 1362–1366.

S. Babin, et al., "Experimental verification of the Temptation (temperature simulation) software tool," (Nov./Dec. 1998) J. Vac. Sci. Technol. B 16(6), pp. 3241–3247.

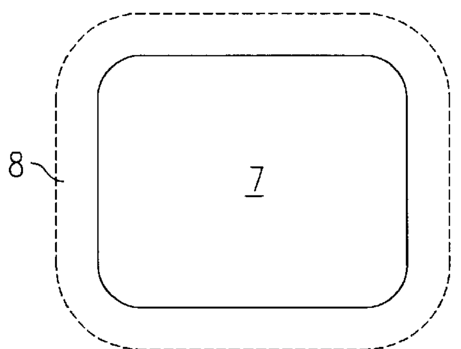
FIG. 2A
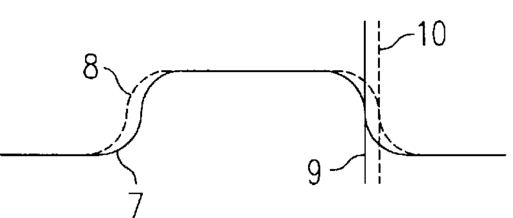
FIG. 2B
FROM FIG. 3A
| | | | | | | | | | | | | | | | | | | | | |
|---|---|---|---|---|---|---|---|---|---|---|---|---|---|---|---|---|---|---|---|---|
| 13 | 0.390 | 0.305 | 0.239 | 0.193 | 0.159 | 0.134 | 0.115 | 0.188 | 0.270 | 0.326 | 0.332 | 0.293 | 0.234 | 0.175 | 0.125 | 0.085 | 0.055 | 0.032 | 0.015 | 0.005 |
| 12 | | | 0.004 | 0.007 | 0.010 | 0.012 | 0.014 | 0.031 | 0.066 | 0.122 | 0.178 | 0.205 | 0.193 | 0.158 | 0.119 | 0.083 | 0.054 | 0.032 | 0.015 | 0.005 |
| 11 | | | | | | | | | 0.004 | 0.017 | 0.052 | 0.101 | 0.131 | 0.129 | 0.107 | 0.079 | 0.053 | 0.031 | 0.015 | 0.005 |
| 10 | | | | | | | | | | | 0.009 | 0.036 | 0.074 | 0.095 | 0.091 | 0.073 | 0.051 | 0.031 | 0.015 | 0.005 |
| 9 | | | | | | | | | | | | 0.009 | 0.035 | 0.064 | 0.074 | 0.066 | 0.048 | 0.030 | 0.015 | 0.005 |
| 8 | | | | | | | | | | | | | 0.014 | 0.039 | 0.057 | 0.057 | 0.045 | 0.029 | 0.014 | 0.005 |
| 7 | | | | | | | | | | | | | 0.005 | 0.022 | 0.042 | 0.049 | 0.042 | 0.028 | 0.014 | 0.005 |
| 6 | | | | | | | | | | | | | | 0.011 | 0.030 | 0.041 | 0.038 | 0.026 | 0.014 | 0.005 |
| 5 | | | | | | | | | | | | | | 0.005 | 0.020 | 0.033 | 0.034 | 0.025 | 0.013 | 0.005 |
| 4 | | | | | | | | | | | | | | | 0.013 | 0.026 | 0.030 | 0.024 | 0.013 | 0.004 |
| 3 | | | | | | | | | | | | | | | 0.008 | 0.021 | 0.027 | 0.022 | 0.013 | 0.004 |
| 2 | | | | | | | | | | | | | | | 0.005 | 0.016 | 0.023 | 0.020 | 0.012 | 0.004 |
| 1 | | | | | | | | | | | | | | | | 0.012 | 0.020 | 0.019 | 0.012 | 0.004 |
| | | | | | | | | | | | | | | | | 0.008 | 0.017 | 0.017 | 0.011 | 0.004 |
| | | | | | | | | | | | | | | | | 0.006 | 0.014 | 0.016 | 0.011 | 0.004 |
| | | | | | | | | | | | | | | | | 0.004 | 0.012 | 0.014 | 0.010 | 0.004 |
FIG. 3B

| | 1 | 2 | 3 | 4 | 5 | 6 | 7 | 8<br>9 | 10<br>13 | 14<br>21 | 22<br>37 | 38<br>69 | 70<br>133 | 134<br>261 | 262<br>517 | 518<br>1029 | 1030<br>2053 | 2054<br>4101 | 4102<br>8197 | 8198<br>16389 |
|---|---|---|---|---|---|---|---|---|---|---|---|---|---|---|---|---|---|---|---|---|
| | | | | | | | | | | | | | | | | | | | 0.003 | |
| | | | | | | | | | | | | | | | | | | | 0.003 | |
| | | | | | | | | | | | | | | | | | | | 0.004 | |
| | | | | | | | | | | | | | | | | | | | 0.004 | |
| | | | | | | | | | | | | | | | | | | 0.003 | 0.005 | |
| | | | | | | | | | | | | | | | | | | 0.004 | 0.005 | |
| | | | | | | | | | | | | | | | | | | 0.004 | 0.005 | |
| | | | | | | | | | | | | | | | | | | 0.005 | 0.006 | |
| | | | | | | | | | | | | | | | | | | 0.006 | 0.006 | 0.003 |
| | | | | | | | | | | | | | | | | | | 0.007 | 0.007 | 0.003 |
| | | | | | | | | | | | | | | | | | 0.004 | 0.008 | 0.007 | 0.003 |
| | | | | | | | | | | | | | | | | | 0.005 | 0.009 | 0.008 | 0.003 |
| 32 | | | | | | | | | | | | | | | | | 0.006 | 0.010 | 0.008 | 0.004 |
| 31 | | | | | | | | | | | | | | | | | 0.008 | 0.011 | 0.009 | 0.004 |
| 30 | | | | | | | | | | | | | | | | | 0.009 | 0.013 | 0.009 | 0.004 |
| 29 | | | | | | | | | | | | | | | | 0.004 | 0.011 | 0.014 | 0.010 | 0.004 |
| 28 | | | | | | | | | | | | | | | | 0.006 | 0.014 | 0.016 | 0.011 | 0.004 |
| 27 | | | | | | | | | | | | | | | | 0.008 | 0.017 | 0.017 | 0.011 | 0.004 |
| 26 | | | | | | | | | | | | | | | | 0.012 | 0.020 | 0.019 | 0.012 | 0.004 |
| 25 | | | | | | | | | | | | | | | 0.005 | 0.016 | 0.023 | 0.020 | 0.012 | 0.004 |
| 24 | | | | | | | | | | | | | | | 0.008 | 0.021 | 0.027 | 0.022 | 0.012 | 0.004 |
| 23 | | | | | | | | | | | | | | | 0.013 | 0.026 | 0.030 | 0.024 | 0.013 | 0.004 |
| 22 | | | | | | | | | | | | | | 0.005 | 0.020 | 0.033 | 0.034 | 0.025 | 0.013 | 0.005 |
| 21 | | | | | | | | | | | | | | 0.011 | 0.030 | 0.041 | 0.038 | 0.026 | 0.014 | 0.005 |
| 20 | | | | | | | | | | | | | 0.005 | 0.022 | 0.042 | 0.049 | 0.042 | 0.028 | 0.014 | 0.005 |
| 19 | | | | | | | | | | | | | 0.014 | 0.039 | 0.057 | 0.057 | 0.045 | 0.029 | 0.014 | 0.005 |
| 18 | | | | | | | | | | | | 0.009 | 0.035 | 0.064 | 0.074 | 0.066 | 0.048 | 0.030 | 0.015 | 0.005 |
| 17 | | | | | | | | | | | 0.009 | 0.036 | 0.074 | 0.095 | 0.091 | 0.073 | 0.051 | 0.031 | 0.015 | 0.005 |
| 16 | | | | | | | | | 0.004 | 0.017 | 0.052 | 0.100 | 0.130 | 0.129 | 0.107 | 0.079 | 0.053 | 0.031 | 0.015 | 0.005 |
| 15 | | | 0.004 | 0.007 | 0.010 | 0.012 | 0.014 | 0.031 | 0.066 | 0.121 | 0.177 | 0.204 | 0.192 | 0.158 | 0.118 | 0.083 | 0.054 | 0.032 | 0.015 | 0.005 |
| 14 | 0.386 | 0.302 | 0.237 | 0.191 | 0.158 | 0.133 | 0.114 | 0.187 | 0.268 | 0.325 | 0.332 | 0.293 | 0.234 | 0.175 | 0.125 | 0.085 | 0.055 | 0.032 | 0.015 | 0.005 |

TO FIG. 3B

*FIG. 3A*

REAL-TIME PREDICTION OF PROXIMITY RESIST HEATING AND CORRECTION OF RASTER SCAN ELECTRON BEAM LITHOGRAPHY

BACKGROUND OF THE INVENTION

1. Technical Field

This invention relates to the general field of electron beam lithography and, more particularly, to real-time correction of the lithography process to compensate for proximity heating of the resist.

2. Description of Related Art

The production of precise patterns on surfaces is a necessary stage in the fabrication of integrated circuits, and finds applicability in many other commercial environments as well. The typical method for creating such patterns is to coat the surface to be patterned with a chemical that undergoes a chemical transformation upon exposure to energy, a "resist." Positive resists undergo chemical transformation on exposure to energy leading to removal of resist from the surface to be etched in the regions so exposed. Negative resists undergo other chemical transformations, such as cross-linking, leading to removal of resist in regions not exposed to energy. Both positive and negative resists are commercially useful. Thus, exposing a resist-coated surface to the appropriate pattern of energy leads to selective removal of resist according to that pattern (exposed or masked), uncovering selected regions of the underlying surface to further chemical etching in a subsequent etching step. Removal of all resist following surface etching leads to the desired pattern etched into the surface.

The energy incident on the resist is typically either electromagnetic or a beam of particles, typically ions or electrons ("e-beam"). In addition, the energy may be directed onto the resist in one of two general ways: 1) through a mask having both transparent and opaque regions therein permitting selective passage of the incident energy to create the desired pattern of exposure on the underlying resist, or 2) as a focused beam, guided so as to impact selectively only those areas requiring exposure. Exposure through a mask is the presently preferred technique for producing numerous identical patterns at reduced costs. However, the mask itself must first be made, most commonly by focused beam impact. Thus, focused beam exposure of resists remains a necessary step in the production of masks for lithography.

Direct beam "writing" of patterns onto resists has several advantages over use of a mask. Among these are avoiding the complications of alignment and registration of the mask and more precise patterning accomplished by precisely focused beams. Thus, beam lithography finds applicability in many areas of technology in addition to mask creation. However, the discussion herein will be particularly directed to e-beam lithography for the production of masks, although other applications for the methods described herein will be apparent to those having ordinary skills in the art. For economy of language we will describe e-beam lithography as typically used in the manufacture of masks, not intending thereby to limit the scope of the invention.

Precise patterning requires precise exposure of resist. For concretness of our description, we will consider the case of positive resists, which are removed from the underlying layer for subsequent etching where the positive resist is exposed to the incident e-beam. Completely analogous effects are present for negative resists as well understood in the art. A sharp boundary is desired between exposed regions and unexposed regions for both types of resist, permitting the mask designer to use more densely packed components without interference and overlap of imprecisely exposed adjacent patterns.

Precise exposure of resist requires a detailed understanding of the sensitivity of the resist to e-beam exposure. The exposure of resist to an e-beam, called the dose, is typically measured in microcoulombs per square centimeter ($\mu C/cm^2$). The sensitivity of the resist means the electron dose (in $\mu C/cm^2$) necessary to create the desired pattern in the resist upon development. This sensitivity is a function of the resist composition, the energy of the incident electron beam, the temperature of the resist, the resist development process and other factors as well. The changes of resist sensitivity with its temperature at the time writing occurs is a particular concern of the present invention.

Scanning the entire surface to be exposed typically involves scanning of the electron beam over a limited area while mechanical translating the surface over a much larger area. Electron beam scanning typically involves rapid transitional motion of the beam across the surface (up to approximately 10,000 cm/sec), but only covering a small region of the surface (typically around a millimeter in lateral extent). The entire substrate is moved mechanically at about 1 cm/sec but over an extent of lateral traverse sufficient that the e-beam exposes the entire surface.

It is helpful to emphasize that exposure of the resist by e-beam impact and heating of the resist are two conceptually distinct phenomena. The chemical activity of the resist leading to its useful lithographic properties is initiated by e-beam impact. The efficacy of electrons in causing this chemical activity is defined as the sensitivity of the resist. The sensitivity of the resist to e-beam impact depends in turn on many factors including the temperature of the resist at the time it is exposed. Thus, changing the temperature of the resist changes its sensitivity which may require changing the dose of electrons or the dwell time of the beam (or both) in order to achieve proper exposure. Failing to take into account changes in resist sensitivity with temperature may lead to overexposure of the resist, exposure of the resist in regions not intended to be fully exposed, and less precise patterns. Pattern "blooming" is the undesired result.

Heating of the resist occurs in two ways: 1) As an inherent adjunct effect to the impact by electrons intentionally directed onto the resist for exposure. This heating is always present in e-beam lithography and is taken into account when the resist is calibrated to specify the correct exposure. 2) In high voltage lithography, most of the electron beam energy passes through the resist and the underlying mask layer (typically very thin) and penetrates the substrate where most of it is deposited. (An exception occurs when thin substrates are used, typically in the manufacture of X-ray masks, where the substrate is itself a film so thin that most of the beam energy passes through it). Electron diffusion in a thick substrate deposits the heat from a single e-beam flash in the substrate, typically in a volume 10 or more microns (micrometers) in lateral extent (perpendicular to the e-beam direction). Subsequent thermal conduction transports a portion of this heat to the substrate surface where it heats the resist in a zone that may be tens of microns in lateral extent a few microseconds following the flash, increasing to a millimeter across after several milliseconds. (Exact numbers will depend on beam energy, the composition of the substrate and its thermal properties). Thereafter the heat has diffused so much as to have no significant effect on resist exposure. It is this second type of heating that this invention addresses and denotes as "proximity heating." Such proximity heating depends on the previously written pattern and the time history of the pattern writing. This variability makes proximity heating particularly challenging to estimate in designing a process for high accuracy e-beam writing.

"Proximity heating" as used herein is not to be confused with the "proximity effect" related to the chemical effects of scattered electrons in the resist. Electrons in a beam passing through matter will from time to time encounter atomic nuclei or orbital electrons and undergo deflection from their line of travel, with or without loss of energy in the deflecting collision. The "proximity effect" relates to the chemical effect these scattered electrons have exposing the resist, perhaps relatively far from the intended exposure zone at which the e-beam is directed. Scattered electrons within the resist may lead to exposure away from the desired exposure zone. Backscattered electrons from layers below the resist may re-enter the resist and also produce deleterious exposure. Many approaches have been suggested to ameliorate the effects of these scattered electrons as they lead to unwanted exposure of the resist including that of Veneklasen et. al. (U.S. Pat. No. 5,847,959). Bohlen et. al. (U.S. Pat. Nos. 4,426,584 and 4,504,558) suggest a second exposure to the incident e-beam designed to correct for dosage losses or (for e-beam exposure through a mask) the use of two complimentary masks. Several ways to correct for the electron beam dosage have been suggested, including the work of Watson (U.S. Pat. No. 5,736,281), Ashton et. al. (U.S. Pat. No. 5,051,598), Owen et. al. (U.S. Pat. No. 5,254,438), and Chung et. al. ( U.S. Pat. No. 5,432,714). In all cases, however, the focus of this work is to prevent or reduce the chemical effect of scattered electrons in causing undesired exposure of the resist. In contrast, the present invention relates to the thermal effect of both incident electrons and scattered electrons as they heat the target indirectly by conduction of heat deposited elsewhere, and the changes in resist sensitivity caused by this heating.

Proximity heating has been the subject of several calculations and measurements. Ralph et. al. describe methods for computing proximity heating by numerical integration of diffusion equations in "Proceedings of the Symposium on Electron and Ion Beam Science and Technology, Tenth International Conference", p. 219–2330 (1983). Babin et. al. also describe methods for the numerical simulation of proximity heating and the comparison of such calculations with measured values. SPIE, Vol. 3048, p. 368–373 (1997) and J. Vac Sci Technol. B Vol. 16, pp. 3241–3247 (1998). Additional calculations of proximity heating and comparison with measured values have been reported by Yasuda et. al. in and J. Vac Sci Technol. B Vol. 12, pp. 1362–1366 (1994).

Calculations of proximity heating are typically based upon a numerical solution of the appropriate diffusion (partial differential) equations. Heat sources may be represented by analytic approximations, or derived directly by numerical Monte Carlo simulation of the electrons penetration into targets, including resists. Prior methods have proven in practice to be too slow in comparison with the speed of e-beam writing to allow real-time computation of proximity heating and adjustment of the writing process in response. The present invention provides methods for rapidly predicting proximity heating on a time scale comparable with the e-beam writing speeds. This real-time prediction of proximity heating allows the properties of the e-beam and/or the writing process to be adjusted while writing is underway to compensate for proximity heating.

BRIEF SUMMARY OF THE INVENTION

Precise writing of patterns in a resist requires precise exposure of the resist which, in turn, requires precise knowledge of the sensitivity of the resist to e-beam impact. Resist sensitivity depends upon the temperature of the resist at the time of writing. Thus, the present invention relates to methods and procedures for determining resist temperature during processing and adjusting process parameters, including reducing the beam current, to compensate for increased resist sensitivity. Typically, the resist temperature rise predicted by the present invention for the point of writing will be multiplied by a factor relating the temperature sensitivity of the resist. The result is a correction applied to the beam current (or dwell time) to provide more accurate resist exposure. The correction will typically be a multiplicative factor less than 1 by which the beam current is to be adjusted to correct for proximity heating at the point of writing. In an analogous manner, corrections to beam dwell time may be used alternatively or in addition to beam current corrections. It is envisioned that e-beam current or the dwell time of each spot or "flash" may be adjusted. Pattern blooming is thereby reduced.

The present invention relates to methods of predicting proximity heating in real-time as the writing proceeds enabling beam compensation to be performed in real-time. Methods of achieving high-processing efficiency are described. A shifted impulse response function is shown to give proximity heating results accurate to within a few percent. It is used for fast evaluation of correction schemes. Advantages of the present invention include the prevention or mitigation of pattern blooming as incident electrons heat the resist and broaden the region of exposure.

BRIEF DESCRIPTION OF THE SEVERAL VIEWS OF THE INVENTION

None of the figures herein are drawn to scale.

FIG. 1A: Schematic cross sectional view of low energy e-beam impact on substrate, mask to be etched and resist.

Figure 1B:
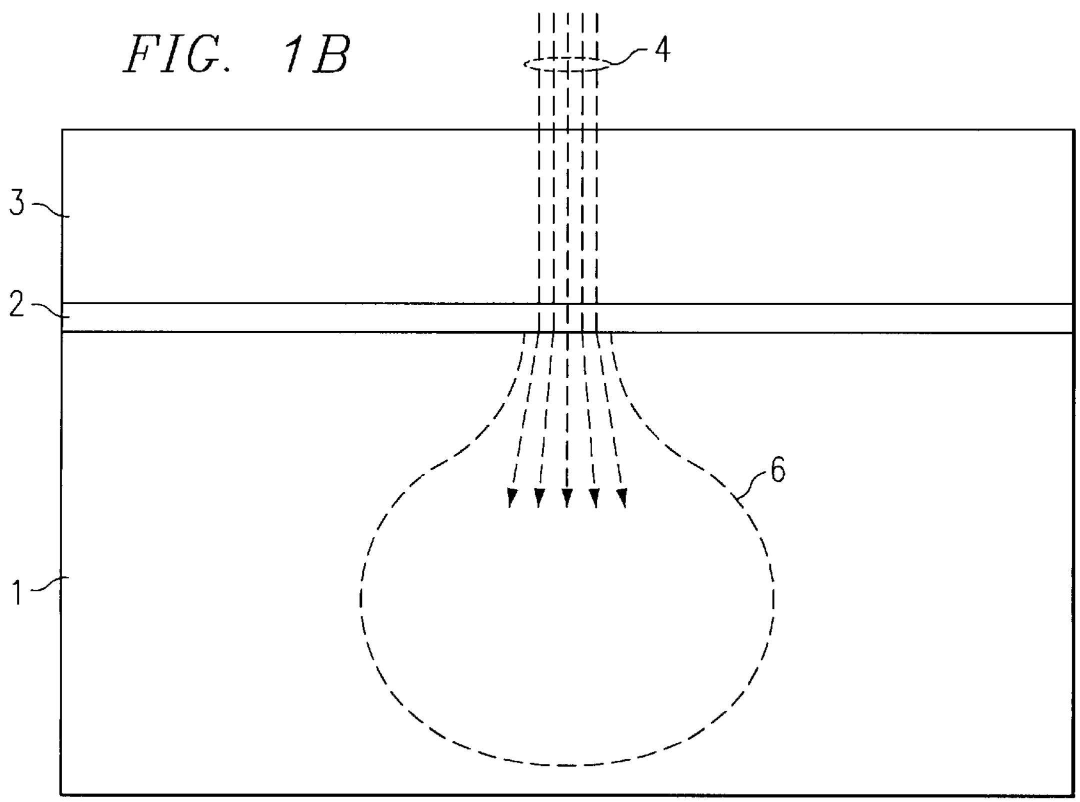

FIG. 1B: Schematic cross sectional view of high energy e-beam impact on substrate, mask to be etched and resist.

FIGS. 2A, 2B: Schematic top view and side view respectively of regions of exposed resist depicting pattern blooming by overexposure.

FIG. 3: Kernel of typical e-beam writing procedure showing typical contributions to proximity heating in ° K above ambient.

Figure 4:
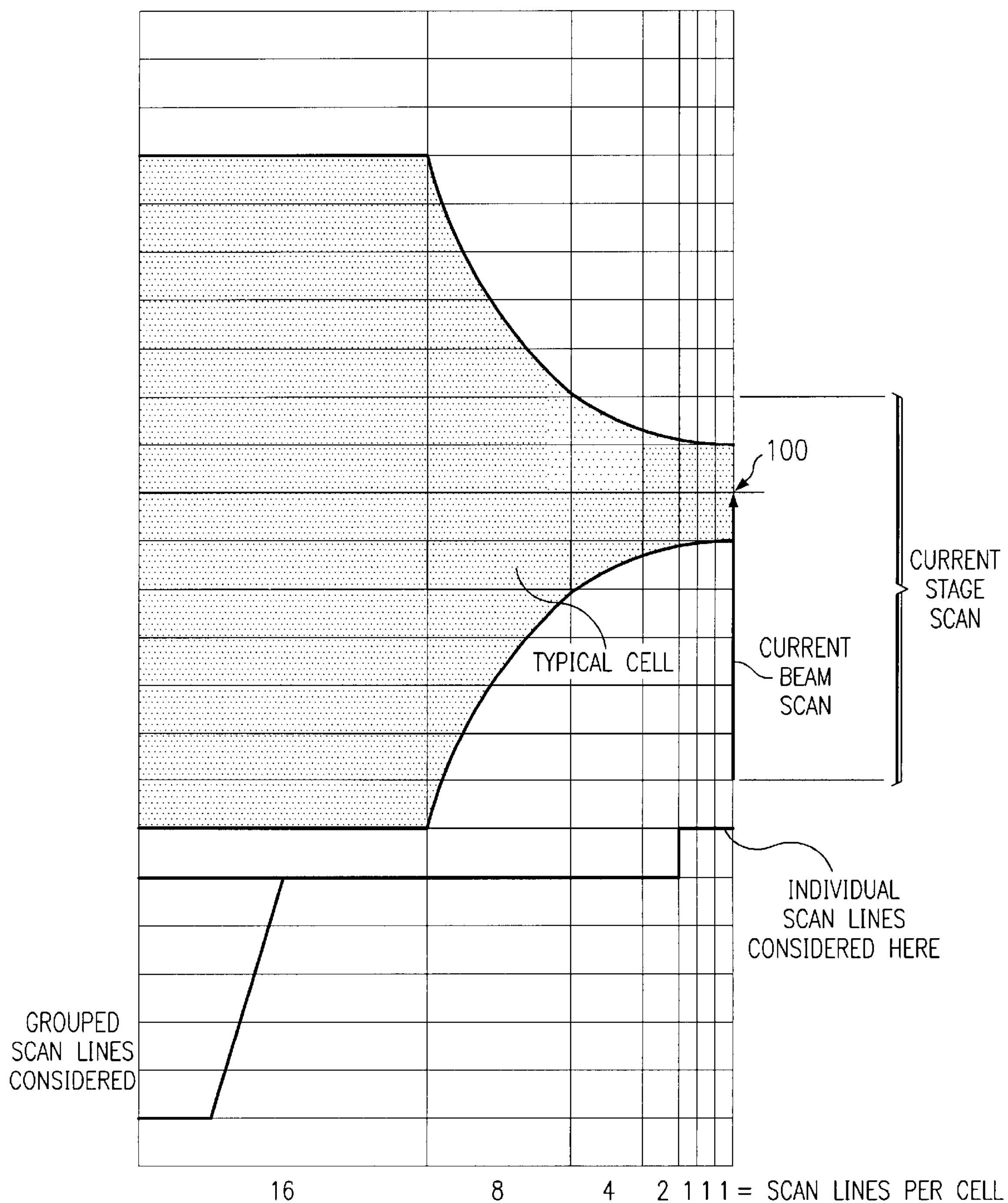

FIG. 4: Schematic depiction of coarse pixelization of kernel.

DETAILED DESCRIPTION OF THE INVENTION

The general mode of operation of e-beam lithography makes use of a focused beam of electrons, accelerated through a voltage, typically 1000 volts (1 keV) and above. Lower voltage e-beams are more effective at exposing the resist. Higher voltage e-beams are preferred for their ability to be formed into more precisely focused beams, resulting in more accurate lithography and the ability to fabricate smaller patterns. "High voltage" e-beams herein is commonly understood to mean e-beam energies above approximately 10 keV. Beam energies as high as 50–100 keV are used. However, high energy e-beams produce undesired heating side effects, the amelioration of which is one object of the present invention.

FIG. 1A depicts schematically and in cross section a beam of low energy electrons (less than approximately 10 keV), 4, incident on a layer of resist, 3. Typically, resist layer, 3, will be relatively thin, around 0.5 $\mu$m ("microns"=$10^{-6}$ meter).

Resist, 3, overlies the layer to be etched, 2, all of which typically are supported by a reasonably thick substrate. For the manufacture of lithography masks, layer, 2, will be generally be the mask material, typically a film of proprietary composition containing chromium and commonly very thin compared to the resist layer. Substrate 1 is typically glass and may be considered to be infinitely thick as none of the effects encountered in e-beam lithography relevant to the invention described herein are affected by the lower surface of a thick glass layer, 2 (not depicted in FIG. 1A). Very thin substrates as would typically be encountered in the fabrication of x-ray lithography masks are an exception. FIG. 1A (in common with all other figures herein) is schematic only and not drawn to scale.

For a low energy beam as depicted in FIG. 1A, significant dissipation of energy and spreading of the e-beam occurs in the resist layer, commencing virtually immediately upon impact with the resist surface, as depicted in FIG. 1A. The spreading of low energy e-beams in width may be commensurate with the depth of penetration. Thus, low energy e-beams tend to scatter in the resist layer, exposing thereby a larger range of resist than desired and exposing the resist in different patterns than intended, broader than the incident beam. This "pattern blooming" is the result of the chemical interaction of scattered electrons with the resist or the "proximity effect." Backscattering from layers underlying the resist layer also leads to unwanted exposure and pattern blooming. The creation of a precise patterns on layer 2 is facilitated by minimal spreading of the e-beam on passage through the resist which favors the use of higher energy beams.

Use of high energy beams requires both higher voltage and higher beam currents. Low energy e-beams deposit a reasonably large fraction of the beam energy in the resist layer where it is needed to expose the resist. Therefore, low energy e-beams require less incident beam intensity (beam current) since more efficient use is made of the available beam intensity in developing the resist. The energy deposited in the target is thus typically significantly less for low energy e-beams since both current and voltage are reduced from that used in high energy e-beam lithography. That is, energy deposited is the product of beam voltage×beam current×exposure duration and both voltage and current are reduced for beam energies less than about 10 keV.

By way of illustration and not limitation, we compare the exposure of resist by a 10 keV beam with that caused by a 50 keV beam. It is noticed experimentally that as beam energy increases the current must increase almost linearly with beam energy to continue to expose the resist adequately. Thus, increasing the beam energy by a factor of 5 from 10 to 50 keV requires a concomitant increase in current by a factor of approximately 5 to adequately expose the resist. The energy deposited per e-beam pulse (or flash) is volts*amps*(pulse duration) which increases by a factor of approximately 25 in this example for equal pulse lengths.

FIG. 1B depicts schematically in cross section (not to scale), e-beam, 4, incident on resist, 3, at high incident beam energies, typically round 50 keV. Beam spreading depicted as 5 in FIG. 1A is typically negligible in the resist layer, 3, for high energy beam impacts as depicted in FIG. 1B. Such high energy beams tend to pass through resist layer, 2, mask layer, 3, and proceed well into the glass substrate, 1, before substantial beam spreading occurs. A heated zone, 6, is thereby created in substrate 1 as the e-beam comes to rest. Typically, for electrons of about 50 kV, zone 6 will be approximately 20 $\mu$m in diameter (micron=$10^{-6}$ meter) with its centroid about 10 $\mu$m below the upper surface of glass substrate, 1, and for small flashes or round spots, have rotational symmetry about the axis defined by the incident e-beam.

As noted above, high voltage e-beams will typically deposit much more energy in substrate, 1, than will low voltage beams, such energy increasing by approximately the square of the beam energy (as the need for increased current must also be met). The energy per pulse may not be substantial, but millions or indeed hundreds of millions of pulses impact the substrate in fully exposing the resist. Therefore, substantial heating of the substrate, 1, may occur with high energy electron beams. Direct heating of the resist layer by the incident e-beam may be significant, but is readily predictable from the applied dose and, therefore, can be compensated by calibration. However, proximity heating of the point at which writing is currently occurring is variable since it is affected by conduction from regions within the substrate where heat was deposited by numerous (typically millions) of earlier pulses. Thus, proximity heating depends on the pattern being written and the timing and ordering of past pulses. The present invention determines the resist temperature at the point of writing from proximity heating and provides the data enabling appropriate beam adjustments.

Raster scan electron beam lithography machines typically scan the electron beam in a linear path about 1 mm in length every 25 microseconds as the mechanical stage moves the substrate in an orthogonal direction at a speed of about 1 cm/sec. The time between the end of one beam scan and the start of the next is about 5 microseconds, called "flyback time." The scan sequence may be raster or serpentine. The temperature of the resist due to earlier writing may vary by tens of degrees along the electron beam scan path which requires that the dose correction be updated every microsecond or every few microseconds. These are approximate numbers that depend on the precise pattern being written, the precise e-beam machine used, the nature of the substrate, the required accuracy, resist sensitivity, and other factors.

It is observed that raster scans may increase resist temperatures by temperatures of the order of 20° C., while vector scans may increase resist temperature up to 100° C. The commonly used Novolac resists change their sensitivity with temperature by approximately 0.2% per deg. C. That is, a 20° C. variation in resist temperature will vary its sensitivity by approximately 4%. This will have a non-trivial blooming effect on e-beam patterns especially for very fine lithography.

FIG. 2 depicts pattern blooming that will typically result from increasing resist sensitivity. 7 in FIG. 2 depicts the desired pattern of exposed resist in top view (FIG. 2A) and side view (FIG. 2B). The pattern and process designer will plan for e-beam exposure such that exposure point 9 (for example) occurs at the desired pattern boundary. However, increased resist sensitivity may lead to full exposure of resist by less-than-expected e-beam dose. That is, the pattern edge moves to position 10, resulting in a broadened pattern depicted by 8.

Babin and co-workers have discussed the relationship between effective resist exposure dose of electrons, the incident e-beam current and the resist temperature in SPIE, Vol. 1671, pp. 93–97 (1992). This research indicates that control of e-beam current can be an effective method for controlling resist over-exposure due to heating. Thus, the present invention relates to methods and procedures for determining resist temperature during processing and adjusting process parameters, including reducing the beam current, to compensate for increased resist sensitivity. Typically, the resist temperature rise predicted by the present invention for the point of writing will be multiplied by a factor relating the temperature sensitivity of the resist. The result is a correction applied to the beam current (or dwell time) to provide more accurate resist exposure. The correction will typically be a multiplicative factor less than 1 (0.97 for example) by which the beam current is to be adjusted to correct for proximity heating at the point of writing. In an analogous manner, corrections to beam dwell time may be used alternatively or in addition to beam current corrections. Pattern blooming is thereby reduced.

As noted elsewhere herein, there has been significant research in calculating proximity heating for e-beam lithography. Accurate predictions require using Monte Carlo simulations to represent single flash heat sources and various techniques exist for solving the thermal diffusion equation including finite element, finite difference or elaborate analytical approximations, but tend to require the very large amounts of computation. The present invention relates to a method for predicting proximity heating in a very rapid manner, thereby making it possible to compute proximity heating corrections to the e-beam process in real-time as the process proceeds. In principle, it would be possible to calculate proximity heating effects for a stipulated e-beam lithography process in advance of actual performance of the process. Thus, one could select a candidate e-beam writing process, specifying all beam and scanning parameters. The proximity heating could be calculated using the methods referred to above taking however long may be necessary. The candidate process parameters would then be adjusted to compensate for proximity heating effects. If necessary, the cycle of proximity heating calculation and parameter adjustment could be iteratively re-done as many times as necessary to converge to a stable set of processing parameters. All of this would be performed off-line (that is, before e-beam lithography begins and typically remote from the e-beam equipment itself). For most practical applications, this approach is prohibitive.

One aspect of the present invention relates to methods for predicting the proximity heating of the resist much more rapidly than previous techniques for the purpose of computing proximity heating in real-time as e-beam writing is underway. The primary advantage of real-time evaluation of proximity heating is best understood in view of the detailed performance of e-beam lithography equipment (typically raster scan) as used in the manufacture of integrated circuits.

A typical modem integrated circuit (such as Pentium II® or the like) may contain $10^7$ transistors and be fabricated in 20 or more layers of lithography. Each lithography layer requires a mask, typically manufactured by means of e-beam lithography. The chip designer provides a data file containing the information as to how the components are to be arranged on the chip, layer by layer. This data file typically has a format "GDSII" that is hierarchical in format in the interests of economy. For example, if a pattern occurs repeatedly in a larger pattern, the subpattern called a "cell" need be specified only once. Its occurrence in the larger pattern then need only be specified as to its location and orientation.

Cells may contain elementary geometries, other cells, arrays of other cells and so on. The GDSII structure thus grows hierarchically to define completely the circuit structure from a collection of subsystems, sub-subsystems, etc. down to elementary geometries to make mask features for fabricating the most elementary components.

The GDSII file is not organized in a manner that a typical e-beam lithography machine can directly use to write a mask. Therefore, the GDSII file must be "fractured" into individual layers and into the geometrical order in which the e-beam machine will write the masks. "Flat format" is the typical description of the fractured GDSII file, providing in the "flat file" the information for writing the flat lithography masks for use making integrated circuits. Raster scan e-beam machines would typically need to fracture the GDSII file into 1 mm strips for raster scanning, sorted into the order in which they will be written. Vector scan e-beam machines would require a different fracturing.

Flat files are typically very large. For example, if a pixel is 0.1 micron ($10^{-7}$ meter), a 10 cm by 10 cm mask will contain $10^{12}$ pixels. If each pixel requires 1 byte of information to specify the e-beam properties for that pixel, $10^{12}$ bytes (1,000 GByte) would be required to store all the information in flat format. Therefore, fracturing the compact GDSII format into the flat format is typically done as needed in real-time for immediate use by the e-beam writing machine. Proximity heating must be calculated from the flat format since, unlike the GDSII format, the flat format contains the information pertaining to the spatial and time order in which the pixels will be written. Prior to fracturing, the GDSII file contains neither the spatial information nor the time information for the e-beam writing in a directly accessible form.

The present invention relates to methods of predicting proximity heating in a time scale comparable with the time of e-beam writing. The GDSII file as typically produced by the chip designer is fragmented into the flat format for concurrent use by the e-beam lithography machine and by the method of the present invention. Unlike previous methods for calculating proximity heating, the present invention is capable of predicting the proximity heating of resists in a time scale that permits adjustment of the modern e-beam writing process in response thereto.

The present method makes use of the classical thermal diffusion equation, Eq. 1

$$(c\partial/\partial t-\kappa\nabla^2)T(r,t)=[P(r,t)*D(\rho)] \qquad \text{Eq. 1}$$

where T is the temperature, r is the position, t is time, c the volumetric heat capacity and κ the thermal conductivity of the substrate. $\nabla^2$ is the Laplacian operator. P(r,t) is the pattern exposure sequence, the "coverage," traced by the electron beam in writing the pattern. D(ρ) is the electron spatial energy diffusion function in the substrate relative to the location of each flash as may be given by an electron diffusion Monte Carlo. ρ is a vector in 3 dimensional coordinate space. [P(r,t)*D(ρ)] denotes the convolution of P and D. The convolution [P(r,t)*D(ρ)] may usefully be considered to be the rate of energy deposition per unit volume at specified points in the substrate. [P(r,t)*D(ρ)] is zero everywhere when the e-beam is turned off.

Equation 1 is well studied in mathematical physics and several techniques for its solution exist, including commercial thermal prediction software such as ANSYS. However, prior techniques are much too slow to provide thermal predictions in time to control the e-beam writing process.

One useful way to solve Eq. 1 more rapidly is to solve Eq. 1 for a single electron beam flash and linearly superpose the resulting calculated temperature over all flashes in the writing sequence. This approximation has been found to give temperatures in good agreement with those typically encountered in e-beam lithography and is justified by the linearity of the differential equation. For example, temperature rises encountered for raster scanning are typically moderate and no significant error is introduced by assuming that thermal parameters of the material are independent of the temperature. Thus, linear superposition of temperatures is expressed as:

$$T=\Sigma_i K_i P_i \quad \text{Eq. 2.}$$

where $\Sigma_i$ denotes summation over all i. T in Eq. 2 denotes the temperature rise over ambient temperature at the present point of beam writing. $P_i$ is coverage (the writing) by the e-beam at the $i^{th}$ pattern pixel on a scale of 0 (no e-beam writing) to 1 (fully covered and exposed pixel i). $K_i$ is the "kernel" and denotes the temperature rise at the present point of writing due to a fully covered pixel (P=1) at location i in Eq. 2. It was shown by Veneklasen et. al. (U.S. Pat. No. 5,847,959) that in raster scan machines, the kernel K is independent of the electron beam scan position within a stage scan and independent of the position of the beam in the current beam scan provided the index i is relative to the current beam position.

More generally, the temperature rise at location j in the current beam scan is given as $$T_j=\Sigma_i K_i P_{ij} \quad \text{Eq. 3a}$$

or:

$$T_j=\Sigma_i K_{ij} P_i \quad \text{Eq. 3b}$$

where the second form must be used in serpentine scanning in which the beam scans from bottom to top of the stage scan stripe on one scan and top to bottom on the next. In equation 3a we must refer to a different pixel set as we advance the point of correction j, but doing so is straightforward. In equation 3b we can use a fixed set of pixels in the writing prior to the current beam scan, but we must use a different kernel set for each new position of the beam j in the current beam scan. When the pixel terms P are chosen as laid out in this invention, most of the K terms are identical in both 3a and 3b allowing the simpler 3a to be used and requiring 3b to be used for only a few of the K terms when 3b must be used for serpentine scanning.

The kernel K depends on beam energy, writing strategy and substrate material but in raster and serpentine scan machines the K do not depend on the pattern being written as was pointed out by Veneklasen et. al. (U.S. Pat. No. 5,847,959). (This is not generally true of machines in which the writing kinematics depend on the pattern being written.) Thus, the for raster and serpentine scan machines, the K can be precomputed by accurate (albeit slow) methods and stored for use as needed in the real-time heating prediction.

The present invention makes optional use of an analytical approximation for resist heating that is accurate for raster scan machines, although not necessarily accurate for other writing strategies. It simplifies and greatly accelerates the prediction of raster scan temperature rise over exact methods. The analytical approximation for temperature rise is:

$$T(°K=\epsilon[2a/(\iota+t)^{3/2}]\exp[-b(r^2+\delta^2)/(\iota+t)] \quad \text{Eq. 4}$$

where $a=c^{1/2}/(4\pi\kappa)^{3/2}$ $b=c/(4\kappa)$

In cgs units we have $\epsilon$=joules c=joules $cm^{-3°}$ $K^{-1}$=volume specific heat $\kappa$=joules $sec^{-1}$ $cm^{-1}$ ° $K^{-1}$=thermal conductivity t=elapsed time in seconds r=surface distance between the heat source $\epsilon$ and the point at which the temperature is being determined (in cm)

When this equation is used for high beam voltage heating prediction, thermal conduction through the thin resist and chrome layers is ignorable and the substrate may be considered one material. This approximation is justified with raster scan because the method can ignore heating of the current flash by other proximate flashes in the current beam scan where conduction through the thin layers may otherwise be significant.

Setting $\delta$=0 and $\tau$=0 in Eq. 4 causes Eq. 4 to reduce to the classical impulse response solution to the diffusion equation, that is the Green's function. Eq. 4 would be precise if the e-beam deposited heat zone were precisely Gaussian in shape with a centroid at depth $\delta$ and a diameter characterized by $(\tau/b)^{1/2}$. In practice, the heat zone is not Gaussian and Eq. 4 gives unreliable answers for small values of t. However, for raster scan e-beam machines, e-beam flashes close together in time correspond to flashes deposited in the same raster scan line. Typical raster scan machines move the e-beam sufficiently rapidly (approximately 50–100 meters/sec) that the writing e-beam is virtually unaffected by recent flashes deposited in the same beam scan line. That is, the e-beam outruns its own heat wave. Therefore, the temperature of the resist being written by the current flash will be virtually unaffected by flashes from the recent past in the same scan lines. Flashes in adjacent raster scan lines in close proximity to the point presently being written are very effective in changing the temperature of the resist, but were not written in the immediate past where Eq. 4 is inaccurate. Such adjacent flashes occurred on a time scale of tens of microseconds or more preceding present writing, ample time for heat to propagate from deep in the substrate where it was deposited to the site being written in the current beam scan path. In this regime, Eq. 4 is quite accurate.

The parameters in Eq. 4 are typically estimated by means of time consuming but accurate Monte Carlo simulations of heating by a single e-beam flash used as a heat source in finite difference or finite element solutions to the classical diffusion equation. Least squares fit the single flash results are the preferred way to ascertain values for $\epsilon$,$\delta$ and $\tau$ in Eq. 4. For 50 keV beam energy in a glass substrate, typical values for $\delta$ are around 10 microns and $\tau$ is about 10 microseconds. $\epsilon$ is the energy deposited per flash and will depend on the machine and resist being used but is approximately $10^{-10}$ joules for a typical raster scan machine: it is not the flash beam energy directly because some energy is backscattered into the vacuum above the substrate. There may be about $10^8$ flashes per $mm^2$ or $10^{10}$ flashes per $cm^2$ resulting in around 1 joule per $cm^2$. The approximation given by Eq. 4 is found in comparison with Monte Carlo simulations and numerical integration of the thermal diffusion equation to be accurate to within a few percent but requiring very much less computer time to obtain the result. For economy of language, we denote as "shifted impulse response function" the temperature calculation given by Eq; 4 including the time shift $\tau$ and the spatial displacement $\delta$.

Fitting to an exact calculation is the preferred way to obtain the parameters $\delta$ and $\tau$. However, a heuristic interpretation of $\delta$ and $\tau$ leads to similar numerical values and affords insight into the physical process. $\delta^2$ displaces the distance $r^2$ by an amount approximately compensating for the fact that e-beam energy is deposited below the surface on which the resist lies. r is the distance in the plane of the resist (xy) between the point at which temperature rise is required and the previously written pixel in the xy plane whose effect on the temperature at r is to be determined (denoted as "origin pixel"). But the e-beam energy used to write the origin pixel is chiefly deposited not in the xy plane of the resist but some distance below, typically around 10 microns at 50 kV. Displacing $r^2$ in Eq. 4 by this $\delta^2$ (0.1 micron)$^2$ approximately adjusts for this displacement below the xy plane using the Pythagorean Theorem. This value of δ is supported by the Monte Carlo simulations that lead to substantially the same value.

There is also a heuristic interpretation for the addition of τ to the time. The energy deposited in the substrate in writing the origin pixel is not deposited at a point, but in a diffuse zone due to electron diffusion. Thus, a response function appropriate for an impulse can be transformed to a Gaussian by displacing time. The addition of τ to the actual time in Eq. 4 mimics the effect that would be expected if the heat deposited in writing the origin pixel were deposited impulsively at a point, but spread according to the impulse response function for a time τ before "starting the clock" on our calculation of heating at distance r.

Eq. 4 is thus used to evaluate the temperature rise at the point of writing (j in Eq. 3) from an origin pixel (i in Eq. 3). Eq. 4 can be used to determine the kernel K used in Eq. 3. The use of Eq. 4 is twofold: It may provide kernel terms K with enough accuracy for heating correction purposes. Even if more accurate final kernel terms are needed, it is invaluable in designing a heating correction scheme because following the scheme of this invention because it allows many alternatives to be explored quickly without the need for time consuming recalculations of the K by exact methods for the scenarios being explored.

It is essential, even with state of the art computing machinery, without significant reduction in accuracy, to group pixels into "coarse pixels" such that the heating effects from each separate pixel may be replaced by the heating effect of a single, aggregated coarse pixel. In the zone of past writing that affects the temperature at the current point of writing, there may be $10^8$ writing pixels. A correction may need to be computed every microsecond or at most every few microseconds at tens of points along the current beam scan in real time. Running the index i over $10^8$ values in equations 3a or 3b is prohibitive in this time and i can at most run over roughly 100 to 1000 terms with present day machines. Thus an economy of a factor of roughly one million may be required without significant loss of accuracy. It is this objective that this invention accomplishes, to permit the calculation to be done in real time.

Once a coarse pixel scheme has been chosen, following the guidelines given below, one evaluates the kernel K values corresponding to them by evaluating the temperature rise due to every writing pixel in a coarse pixel assuming that all of the writing pixels are full coverage. This is done for every coarse pixel yielding a complete set of K. Once computed for a given choice of coarse pixels, these K are saved for use in Eq 3 and do not have to be recomputed unless there is a change in writing strategy, substrate material, etc. Thus Eq. 3 effectively sums over every writing pixel because that is how the K were computed: Each K value represents a summation that was done "off line", i.e. not in real time, leaving for the real time processor the much smaller task of summing over roughly 100–1000 terms. If the actual coverage of each writing pixel within a coarse pixel were $P_i$, the temperature at the point of correction due to $P_i$ would be exactly $P_iK_i$. If this were true for every coarse pixel, Eq. 3 would compute the temperature without approximation. The approximation of Eq 3 lies in the assumption that the coverage inside the coarse pixel i is uniform, which generally will not precisely be the case. A second approximation is that we are not computing the correction for every writing pixel in the current beam scan but only for a set of discrete points over which the index j runs. For each proposed coarse pixel scheme, the magnitude of the errors made by these assumptions is determinable by methods that are standard in numerical analysis and can be compared with the error budget of the machine. Finer coarse pixels and more points of correction will give more accurate predictions at the expense of greater demands on the real time processor which may be demanded by tighter error budget tolerances. We thus seek a way of breaking the summation of equation 3 into two summations: A computationally intensive pre-calculation of the kernel K, leaving a much simpler task to the real time processor of evaluating a relatively small number of terms in Eq. 3. The methods of this invention show that this objective can be achieved with little loss of accuracy Eq. 4 is invaluable as a means of computing the K for proposed coarse pixel schemes for the purposes of evaluating the error budget-computing burden trade off. Once a scheme has been selected, the K values for that scheme can be re-computed using exact methods if necessary.

A guiding objective is to group the pixels into coarse pixels such that the heating effect at the point of writing is approximately equal in the core of the kernel for each coarse pixel. Exact equality is not necessary, but the further one deviates from this guiding principle in this scheme, the more the computing burden increases with little gain in accuracy. Therefore, as coarse pixels become more remote from the writing point, an increasing number of writing pixels are aggregated into each coarse pixel. Pixels sufficiently remote in time and distance do not contribute in any significant manner no matter how many are aggregated. These pixels are ignored. The meaning of the word "remote" is not obvious because heating is a fairly complicated function of both distance and time. In particular, pixels in adjacent stage scans are ignored, a considerable simplification justified by the time the mechanical stage takes to transfer from one scan to the next. Pixels in the current beam scan are ignored because in high voltage lithography, heat is deposited sufficiently deep in the substrate that the fast raster scan beam will move away before much heat from earlier pixels can propagate to the surface: Thus the inclusion of higher order terms in the scheme or the need to iterate can be avoided without loss of accuracy. Without doing detailed calculations with Eq. 4, it is not easy to know which pixels one can ignore and which cannot be ignored because the temperature they contribute is an interaction between the complex function referred to above and the kinematics of the writing strategy of the machine. The coarse pixel scheme must necessarily include all written pixels in the current stage stripe at one time or another. It would thus be a simple choice to include all of them in the evaluation of Eq. 3. However, doing so will waste time computing insignificant contributors. One aspect of this invention lies in providing methods of not only including significant contributors in a balanced way but in rejecting insignificant contributors that would waste valuable computing time.

An important advantage of the scheme is the justification for ignoring pixels in the current beam scan in raster scan machines. This allows the heating correction to be included in its own calculation, avoiding higher order terms or having to iterate to improve accuracy. The first iteration of this method gives the correct temperature (for uniform coverage). This fact of raster scan generally cannot be taken advantage of in other writing strategies in which the beam does not outrun its own heat wave.

Accordingly, useful guidelines have been developed for aggregating individual pixels into coarse pixels that allow the enormous economy of calculation to be achieved without significant loss of accuracy. It is useful to divide the stage (mechanical) scan into bands running in the stage scan direction having widths in the beam scan direction comparable to the electron diffusion length in the substrate material, which may be approximated by the value of the exponent in Eq. 4. The parameter, δ, or a parameter having substantially the same function, is preferably included in this exponent to account for both electron and thermal diffusion. The resulting bands define cell boundaries in the beam scan direction. The number of bands typically may be in the 16 to 128 range. This description assumes 32 for purposes of illustration. Electron diffusion at high beam energies causes the heat to be deposited in the substrate (typically glass) in a zone much larger than the writing pixel size. These bands represent a piecewise averaging of the pattern in the scan direction. The pattern variations in typical high voltage e-beam microlithography are commonly much finer than the electron diffusion length. Thus, in the practice of the present invention it is useful that the band widths not be substantially wider than the electron diffusion length to avoid loss of accuracy. Conversely, making the bands much narrower would increase the computer processing requirements without a concurrent gain in accuracy.

FIG. 3 depicts schematically a typically kernel K as would be needed in the evaluation of Eq. 3. It was computed using Eq 4 assuming the writing strategy of a typical 50 kV raster scan machine. The horizontal lines represent the stage stripe boundaries. The numbers at the top of the column are the beam scan number included in the coarse pixels. In this scheme FIG. 3 is intended to represent the raster scanning of a substrate in which the scanning beam writes from bottom to top. The numerical values along the vertical axis in FIG. 3 denote the index of the coarse pixel bands, 32 are shown in this example but other choices are possible which need not be a power of 2. The same index, thought of as a continuous variable can be thought of as representing the writing pixel presently being written by the scanning e-beam, where 0.0 in this example represents the bottom edge of the stage scan and 32.0 the top edge. The coarse pixel bands are numbered 1 to 32. The current point of writing or the point for which the correction is being computed is on the boundary between band 13 and band 14 or a continuous variable value of 13.0 on this scale. Although choices of the correction point may be made other than on band boundaries, a immediate advantage of placing the correction points on boundaries is that the scheme is highly symmetrical, reducing the required number of kernel terms K needed in Eq. 3 by a factor of 2, because the common kernel terms can be factored to give terms of the form $K_i(P_p+P_q)$, thereby reducing the number of multiplications by a factor of 2. Line 0 is the current scan, 1 the previous scan. Higher numbers represent beam scan lines in the more remote past. Line 0 has no kernel values because it is not included in the method as described earlier: it does not heat itself. Note that 1–7 columns only contain one scan line each because grouping them would generally result in loss of accuracy: If we grouped line 1 and 2 into a common set 32 coarse pixels, the full coverage temperature at the correction point from band 14 would be 0.386+0.302= 0.688° C. temperature rise in this example, or a half coverage value of 0.344. However if the coverage was full in line 1 and 0 in line 2, which is also ½ average coverage, Eq. 3 would compute a temperature of 0.344 instead of 0.386 of an error of 0.042° C. for just one element in the summation inviting much larger error for many such terms. Although the first 7 lines occurred singly in the coarse pixel scheme in this example, the needs at hand may dictate a different number and perhaps no single line groups at all in less demanding cases.

In the coding of Eq 3, the only terms that would be included in FIG. 3 are those explicitly shown. The white space regions in FIG. 3 contain small contributors that in aggregate make an insignificant contribution to the temperature at the correction point. Because all pixels in the stage stripe will eventually be included in the heating correction somewhere, it may appear that this selective exclusion of terms that is correction point dependent can be avoided by simply summing over all terms. However the increase in complexity of the code is a price well worth paying because it saves computing time for the significant terms and does not waste it on the insignificant. The inaccuracy introduced by this exclusion can be tested by evaluating all of the kennel terms in the array and summing them then summing again excluding terms less than some limit. A limit of 0.003° C. was used on FIG. 3. This makes a small error in temperature with a great reduction in computing time. If the computing time is available, it is better spent by making the resolution of the scheme higher, for example by using 48 or 64 bands instead of 32, rather than wastefully summing over near zero terms in a 32 band scheme.

The shaded blocks in FIG. 3 show where economy is possible by aggregating not only in the stage scan direction by grouping scan lines, but in the beam scan direction by grouping coarse pixels. For example, in the case of scan lines 8198 through 16389 in this example, a single kernel value of 0.004 could be factored out of 32 terms of Eq. 3; only 4 kernel values are needed for the grouping of lines 4102–8197, and so on. It has been found preferable to look for such economies in the actual computed kernels rather than to invent algorithms that attempt to predict them.

When the beam advances beyond the mid point of band 14 in FIG. 3, it will be necessary to advance the index j of Eq. 3. This will have the effect of sliding the kernel scheme of Eq. 3 one band upwards causing it to overlap a new set of coarse pixels. The kernel scheme evidently can overlap into adjacent stage scans. This does not mean that the convolution of the kernel must be made with writing that actually occurred there. One must either avoid summation over these adjacent stage scan overlap terms or provide storage for them that is permanently set to zero, because, unlike proximity backscatter, the adjacent scans contribute practically nothing to the current point of writing temperature: it occurred too long ago. The kernel scheme must include these terms however, because in some positions of the beam in the current beam scan, these kernel terms will overlap writing in the current stage scan which can cause proximity heating.

In computing the kernel scheme of FIG. 3 for raster scan, it will be found to be invariant with respect to the assumed position of the correction point on any band boundary. However if it is computed for serpentine scanning, the kernel terms of the odd numbered past scans will be found to be a function of position of the point of correction j. However, this dependence will be found to pertain significantly only to a few of the most recent odd numbered scan lines, perhaps 1, 3 and maybe 5. For this small number of terms an array of K indexed on j will be needed. The rest of the elements will be practically identical to raster scan and the same array may be used either for raster or serpentine scanning.

To conserve computer resources, paths remote from the path presently being written are aggregated and considered as a single source of heating. Paths 8–9, 10–13, 14–21 and the like denote an aggregation of the numbered paths. The power of 2 grouping of this example in which the number of lines included in the aggregate groups is 2, 4, 8, 16 and so on is convenient for purposes of updating the pixels after each beam scan completes, but other grouping schemes could be used. This approximation introduces no serious errors but saves considerable computer resources by avoiding the need to sum a great many very small numbers. In summary, the kernel depicted in FIG. 3 represents a region of scanned surface in which the e-beam writes from bottom to top and scans these paths repetitively from right to left sequentially. The pixel presently being written is #13 in path zero, or midway between bands 13 and 14.

For paths written in the more distant past than paths 9 (in the example depicted in FIG. 3), it is convenient to group the paths for convenience of numerical evaluation. It is found useful in the practice of the present invention that each value contributing to the temperature rise at the pixel presently being roughly equal temperatures near the core of the kernel in the interests of computational efficiency. Therefore, scanned paths remote from the pixel presently being written are aggregated and a net contribution calculated according to the prescription of Eq. 3. It is preferred in the practice of the present invention that this aggregation proceed exponentially once begun. That is, once scanned path aggregation begins, the aggregation should include an exponentially increasing number of paths. In some cases, using a power of 2 law simplifies the pixel update scheme, described below. FIG. 3 depicts this as path 7 (an aggregation of 1), path 8–9 (an aggregation of 2), path 10–13 (an aggregation of 4), path 14–21 (8), etc. doubling with each new aggregation. This procedure has been found to reduce computational effort without significantly reducing the accuracy of the results.

FIG. 4 depicts the construction of coarse pixels from a scanning pattern as a schematic depiction similar to FIG. 3 (stage motion from left to right in FIG. 4 and beam scanning from bottom to top). FIG. 4 has been simplified from the full detail that will typically be encountered in practice for purposes of clarity and is not a limitation on the scope of the present invention. The grouped scan lines are more likely to be 4096 or 8192 (or some other large power of 2) rather than the 16 depicted in FIG. 4. The shaded area depicts the region containing the pixels or coarse pixels (called "cell" herein) that must be included in the calculation of the current point of writing (100 in FIG. 4). For several scan lines written in the recent past, this zone includes only one cell in the beam scan direction above and below the current point of writing, 100. Heating from cells written further back in time are aggregated into 4, 8 etc. as denoted on the horizontal axis of FIG. 4. Thus, the included zone fans out from right to left in FIG. 4.

Specific numerical values for temperatures, coarse pixel groupings, etc. depend on the process parameters such as beam energy, writing strategy, substrate material and the like. However, in the practice of the present invention, numerical values are to be used in Eq. 4 as determined for the particular process under consideration and verified by accurate Monte Carlo simulations of single flash heat sources, solutions to the diffusion equation or experimental measurements. A particular example is provided herein. However, the guidelines given above are intended to focus and direct the procedure to achieve effective kernel construction and proximity heating values for other processes without undue experimentation.

The method of the present invention can be implemented on any processor capable of performing the numerical evaluations concurrently with e-beam writing. Simple implementations will run on Pentium-II® processors and processors having similar capabilities such as Digital Signal Processors are typically sufficient. Field Programmable Gate Arrays can also be configured to perform the calculations called for in the practice of the present invention. The processor should have suitable peripheral equipment to accept information from the flat file or the e-beam blanker as the e-beam performs its writing. This information will typically include the location of the present writing point, the dose delivered to each writing pixel. Parameters not changed during the process need not be supplied at every pixel. Summation of the writing pixels to form coarse pixels may require special equipment that may be analog or digital but which supplies a digital input to the resist heating processor evaluating Eq. 3. It is desirable that this data represent as accurately as possible the energy deposited by the electron beam and should therefore include resist heating correction, backscatter proximity correction and any other adjustments to the dose. This data is stored in an array of cells, which would be an array of 32 in the example of FIG. 3. After each beam scan completes this array is transferred effectively into the coarse pixel memory becoming the new scan line 1 of FIG. 3, old scan line 1 becomes the new scan line 2 and so on. This is most easily accomplished using a two dimensional circular buffer memory containing in the FIG. 3 example, 32 coarse pixels in one dimension corresponding to the beam scan direction and every one of the past scan lines represented in the P memory in the stage scan direction. After each scan line a pointer into this memory is decremented and the just completed scan data loaded thereby overwriting the oldest scan line in this buffer. The P memory is then updated from this buffer before the next scan begins. How this is done will be evident to those skilled in the programming arts, however the following pointers are given for the sake of completeness: Updating the P memory from the circular buffer for scan lines 1–7 in FIG. 3 is a simple one-on-one replacement. For the coarse pixels containing multiple scan lines the scan line N becoming a new member of the group is added element for element in the beam scan coordinate and the line M departing from the group likewise subtracted. If Eq. 3 is coded in fixed point it may be desirable to keep the groups normalized by dividing their members by the number of scan lines they contain so that the all K terms represent actual number of degrees Centigrade rise at some fixed point scale. Thus the update process for a group containing n lines would be the add to the $P_j$ the quantity $(N_j-M_j)/n$, for j=1,32 in the FIG. 3 example. The advantage of having the groups contain a power of 2 scan lines is that n is then a power of 2 and division by a power of two is fast in a binary machine. It is likewise desirable that the circular buffer have a power of 2 dimension in the stage scan direction.

At he beginning of each stage scan or interruption of stage scanning, the P and circular buffer memories must be cleared and the mechanical system wait long enough for the substrate to cool before writing resumes. This will typically be in less than 1 second.

Proximity heating data derived by the methods of the present invention are typically returned to the e-beam writing instrument for use in adjusting the writing to compensate for the temperature-induced change in the resist sensitivity. The resist heating processor must convert the temperature rise into a dose adjustment using information concerning the thermal sensitivity of the resist in use. The specific manner in which the e-beam will be adjusted will depend significantly on the details of the particular e-beam machine. The beam current may be adjusted in response to the proximity heating or should current adjustment be infeasible or impractical, flash dwell time may also be adjusted. The specific manner of adjusting the e-beam in response to the information provided by the method of the present invention is not critical in the practice of the present invention and will largely be determined by the characteristics of the e-beam machine being used.

Having described the invention in detail, those skilled in the art will appreciate that, given the present disclosure, modifications may be made to the invention without departing from the spirit of the inventive concept described herein. Therefore, it is not intended that the scope of the invention be limited, to the specific and preferred embodiments illustrated and described. Rather, it is intended that the scope of the invention be determined by the appended claims.

We claim:

1. A computer-readable storage medium storing software executable by a computer, the software including instructions for:

a) computing an estimated temperature change at a point of writing of an electron beam by a shifted impulse response function and using this estimated temperature change to compute a kernel; and, b) computing a temperature change at the point of writing by using said precomputed kernel convolved with a non-linear coarse pixel scheme;

c) computing a change in resist sensitivity at said point of writing caused by the temperature change computed in step (b); and, d) adjusting said electron beam to compensate for said change in said resist sensitivity.

2. A computer-readable storage medium as in claim 1 wherein the time shift in said shifted impulse response function is substantially the time for a point deposit of beam energy to diffusely obtain the size of the actual deposit of beam energy.

3. A computer-readable storage medium as in claim 1 wherein the spatial displacement in said shifted impulse response function is substantially the square of the distance from the centroid of energy deposit of said beam to said point of writing.

4. A computer-readable storage medium as in claim 1 further comprising immediately preceding (a), (a') aggregating previously written pixels remote from said point of writing into coarse pixels.

5. A computer-readable storage medium as in claim 1 wherein said coarse pixels are chosen to contribute approximately the same temperature to said heating of said writing point.

6. A computer-readable storage medium as in claim 3 wherein said aggregating of pixels is an exponential aggregation of beam scan lines remote from said writing point.

7. A computer-readable storage medium as in claim 3 wherein said coarse pixels have a length in the beam scan direction approximately equal to the beam diffusion length.

8. A computer-readable storage medium as in claim 1 wherein said adjusting of said electron beam is an adjustment of the current of said beam.

9. A computer-readable storage medium as in claim 1 wherein said adjusting of said electron beam is an adjustment of the dwell time of said beam on said point of writing.

10. A system for correcting electron beam lithography for proximity heating of the resist comprising an electron beam lithography machine connected to a processor, said processor containing software including instructions for: a) computing an estimated temperature change at a point of writing by a shifted impulse response function and using this estimated temperature change to compute a kernel; and, b) computing a temperature change at the point of writing using said precomputed kernel convolved with a nonlinear pixel scheme; c) computing a change in resist sensitivity at said point of writing caused by the temperature change computed in step (b); and, d) adjusting said electron beam to compensate for said change in said resist sensitivity.

11. A system as in claim 10 wherein the time shift in said shifted impulse response function is substantially the time for a point deposit of beam energy to diffusely obtain the size of the actual deposit of beam energy.

12. A system as in claim 10 wherein the spatial displacement in said shifted impulse response function is substantially the square of the distance from the centroid of energy deposit of said beam to said point of writing.

13. A system as in claim 10 further comprising immediately preceding (a), (a') aggregating previously written pixels remote from said point of writing into a non linear scheme of coarse pixels.

14. A system as in claim 12 wherein said coarse pixels are chosen to contribute from approximately the same temperature to said heating of said writing point.

15. A system as in claim 12 wherein said aggregating of pixels is an exponential aggregation of beam scan lines remote from said writing point.

16. A system as in claim 12 wherein said coarse pixels have a length in the beam scan direction approximately equal to the beam diffusion length.

17. A system as in claim 12 further comprising exclusion of insignificant terms in the convolution.

18. A system as in claim 10 wherein said adjusting of said electron beam is an adjustment of the current of said beam.

19. A system as in claim 10 wherein said adjusting of said electron beam is an adjustment of the dwell time of said beam on said point of writing.

* * * * *